United States Patent [19]
Ferraiolo et al.

[11] Patent Number: 5,739,725
[45] Date of Patent: Apr. 14, 1998

[54] DIGITALLY CONTROLLED OSCILLATOR CIRCUIT

[75] Inventors: Frank David Ferraiolo, Essex Junction; John Edwin Gersbach, Burlington; Charles Joseph Masenas, Jr., Essex Junction, all of Vt.

[73] Assignee: International Business Machines Corporation, Armonk, N.Y.

[21] Appl. No.: 593,754

[22] Filed: Jan. 29, 1996

[51] Int. Cl.⁶ .......................................... H03L 7/06
[52] U.S. Cl. ........................ 331/57; 331/10; 331/17; 331/34
[58] Field of Search .................... 331/57, 10, 17, 331/34

[56] References Cited

U.S. PATENT DOCUMENTS

| | | | |
|---|---|---|---|
| 5,278,522 | 1/1994 | Atriss et al. | 331/57 |
| 5,304,955 | 4/1994 | Atriss et al. | 331/1 |
| 5,331,294 | 7/1994 | Watanabe et al. | 331/57 |
| 5,349,311 | 9/1994 | Mentzer | 331/57 |
| 5,382,921 | 1/1995 | Estrada et al. | 331/1 |
| 5,394,116 | 2/1995 | Kasturia | 331/34 |
| 5,416,446 | 5/1995 | Holler, Jr. et al. | 331/57 |
| 5,418,499 | 5/1995 | Nakao | 331/57 |
| 5,420,546 | 5/1995 | Watanabe et al. | 331/57 |
| 5,495,205 | 2/1996 | Parker et al. | 331/14 |
| 5,498,998 | 3/1996 | Gehrke et al. | 331/17 |

*Primary Examiner*—Timothy P. Callahan
*Assistant Examiner*—An T. Luu
*Attorney, Agent, or Firm*—Michael J. Balconi-Lamica, Esq.; Jenkens & Gilchrist, P.C.; Robert A. Walsh, Esq.

[57] ABSTRACT

A variable frequency oscillator circuit includes a ring oscillator circuit, a plurality of adjustment means for adjusting an output frequency of the ring oscillator circuit, at least one of the adjustment means having monotonic behavior, adapted to switch between first adjustment levels at a first rate and at least one of the adjustment means having non-monotonic behavior, adapted to switch between second adjustment levels at a second rate which is less than the first rate, such that the means having monotonic behavior adjusts for monotonicity errors which occur during switching.

16 Claims, 4 Drawing Sheets

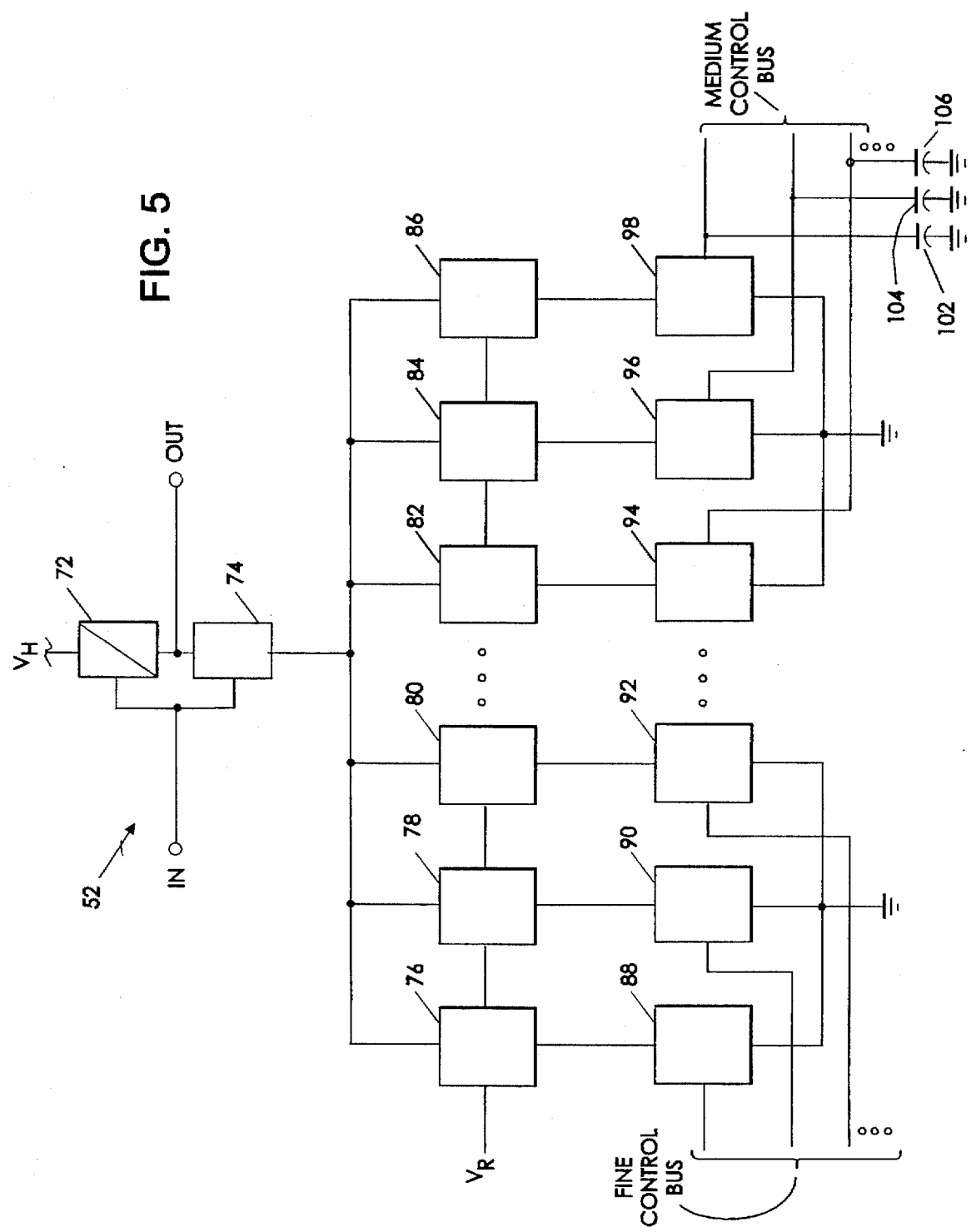

DIGITALLY CONTROLLED OSCILLATOR CIRCUIT

TECHNICAL FIELD OF THE INVENTION

The present invention relates to variable frequency oscillator circuits, and more particularly to variable frequency oscillator circuits having one or more output signals with frequency controllable by digital signals.

1. Background of the Invention

A digitally controlled oscillator (DCO) is an implementation of a variable frequency oscillator where the output frequency of the oscillator is controlled by one or more digital input signals. One implementation of the DCO uses variable delay ring oscillators which require a large number of delay elements in order to obtain desirable frequency control quantization.

The function of a DCO, as, for example, in a digital phase lock loop (PLL), is to provide a clock signal which has a frequency which can be adjusted in response to digital signals, and where the incremental change in frequency can be small enough so as to result in quantization related frequency and phase jitter which are below predetermined limits.

A prior art phase lock loop is shown in FIG. 1. It is very similar to the conventional analog phase lock loop; however, it is implemented with digital components. Phase lock loop 10 includes a digitally controlled oscillator 12 having a controlled frequency output on line 15, an input filter 14 which may be implemented as an up/down counter providing control signals to DCO 12. Filter 14 receives inputs from phase comparator 16 which is a circuit well known in the art. Phase comparator 16 has an external input 13 which is compared with the output of DCO 12 operated on by divide circuit 18.

A conventional DCO has a delay element consisting of a number of components equal to the number of delay values to which it can be set. Binary scaling, if extended, becomes non-monotonic, causing unacceptable jitter. Thus, extending the range of a DCO without increasing jitter requires a very large number of delay elements and controls which uses a large area of a semiconductor chip.

2. Prior Art

In the prior art there are many techniques for controlling output frequency of oscillators. The following are examples of the prior art.

U.S. Pat. No. 5,418,499 entitled "Ring Oscillator Having Selectable Number of Inverter Stages" teaches control of the number of inverter stages in a ring oscillator and control of the current supplied to the inverters to obtain coarse and fine control of frequency of oscillation of the ring oscillator. However, the means by which such control is obtained in this patent are significantly different from what is taught and claimed herein.

U.S. Pat. No. 5,278,522 entitled "High Frequency Voltage Controlled Oscillator" teaches the use of controllable loads to control currents supplied to a VCO and thereby to control the operating frequency. The patent does not teach nor suggest the present invention as taught and claimed herein.

U.S. Pat. No. 5,416,446 entitled "Digital Programmable Frequency Generator" teaches the use of banks of transistors to control oscillator frequency by selectively turning transistor pairs on or off within each bank, selectively changing the current supply to a current starved oscillator. There is a binary relationship between the banks in that the current passed by a transistor pair in one bank is a predetermined power of two greater than the current passed by a transistor pair in another bank. The transistor sizes in a given bank are the same, thus passing the same current as any other pair of transistors in the same bank. The patent does not teach a monotonic frequency adjustment mechanism as is taught and claimed herein.

U.S. Pat. No. 5,382,921 entitled "Automatic Selection of an Operating Frequency in a Low Gain Broad Band Phase Lock Loop System" teaches a method of locking one frequency to another by changing the number of ring oscillator stages and changing the current provided to the stages in use, employing up/down counters as part of the control mechanism. Although the patent teaches a very coarse frequency control mechanism by changing the number of stages in a ring oscillator, it does not teach the monotonic frequency adjustment as is taught and claimed herein.

U.S. Pat. No. 5,331,294 entitled "Oscillation Circuit Including a Ring Oscillator Having a Changeable Number of Inverter Circuits" teaches an oscillator circuit having an output frequency set by changing the number of ring oscillator stages in response to an external signal. As with the 921 patent discussed above, the 294 patent does not teach the monotonic frequency adjustment means as is taught and claimed herein.

U.S. Pat. No. 5,394,116 entitled "Fractional Phase Shift Ring Oscillator Arrangement" teaches a method of obtaining a clock signal at a plurality of phase delays by selectively tapping different points along a ring oscillator. Although the patent generally deals with the ring oscillator frequency control, it does not teach nor suggest the frequency adjustment mechanism as is taught and claimed herein.

Although the patents generally teach digital control of frequency of an oscillator circuit, none of the above patents teaches the invention as taught and claimed herein.

SUMMARY OF THE INVENTION

Therefore, it is an object of the present invention to generate clock signals in a digitally controlled oscillator having monotonic behavior over a wide range of frequencies.

Accordingly, a variable frequency oscillator circuit includes a ring oscillator circuit, a plurality of adjustment means for adjusting an output frequency of the ring oscillator circuit, at least one of the adjustment means having monotonic behavior, adapted to switch between first adjustment levels at a first rate and at least one of the adjustment means having non-monotonic behavior, adapted to switch between second adjustment levels at a second rate which is less than the first rate, such that the means having monotonic behavior adjusts for monotonicity errors which occur during switching.

It is an advantage of the present invention that clock signals are generated in a digitally controlled oscillator having monotonic behavior over a wide range of frequencies with reduced jitter and smaller delay increments than prior art circuits.

Other features and advantages of the present invention will become apparent in the following detailed description of the preferred embodiment of the invention taken in conjunction with the accompanying drawing.

BRIEF DESCRIPTION OF THE DRAWING

FIG. 5 is a circuit diagram of a digitally controlled delay circuit in accordance with the present invention.

DETAILED DESCRIPTION OF A PREFERRED EMBODIMENT OF THE INVENTION

Figure 1:
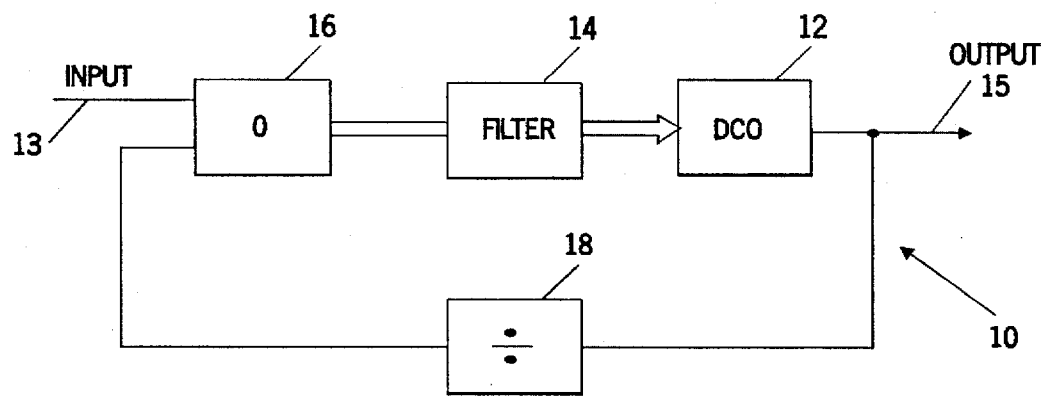
FIG. 1 is a block diagram of a prior art phase lock loop circuit.
Figure 2:
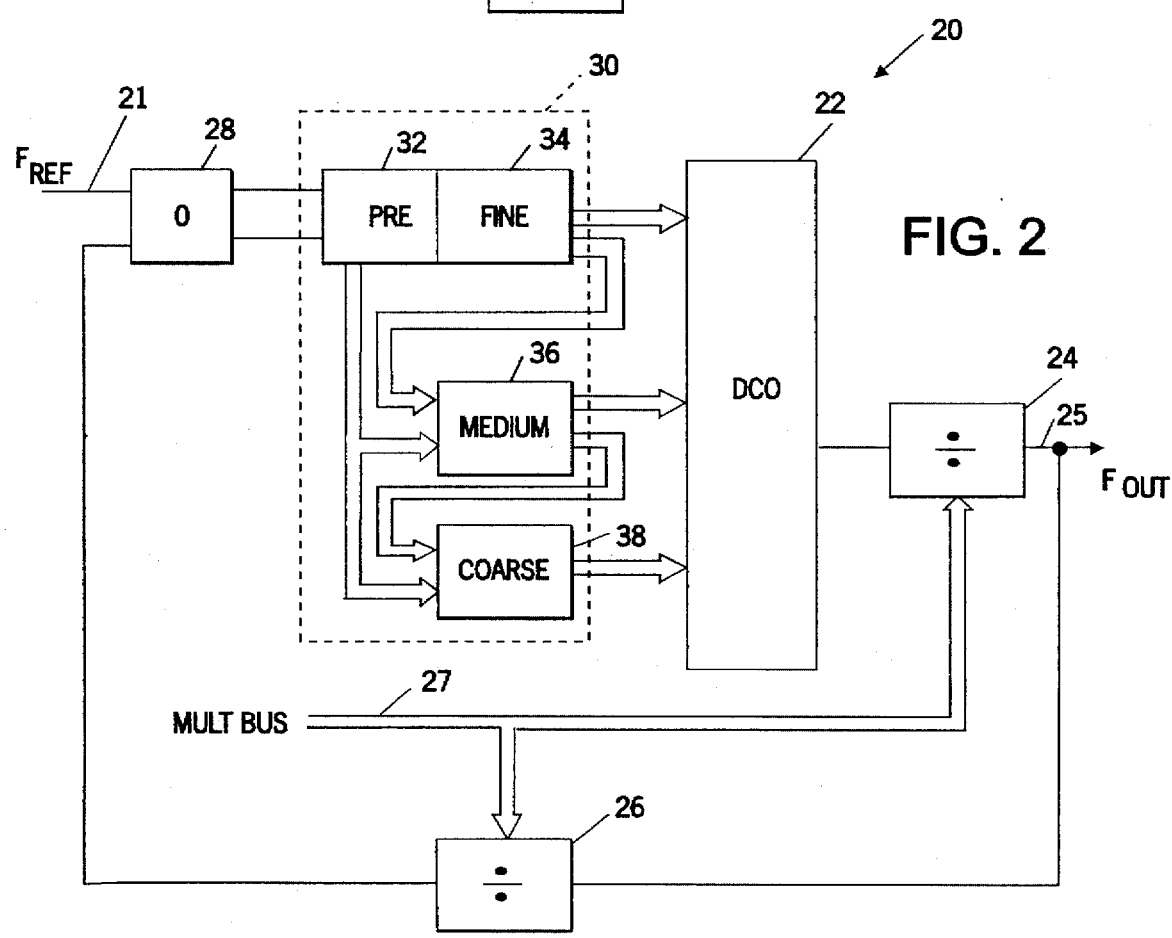
FIG. 2 is a block diagram of a digital phase lock loop circuit embodying the present invention.

Referring now to FIG. 2, a digital PLL in accordance with the present invention will be described.

Figure 3:
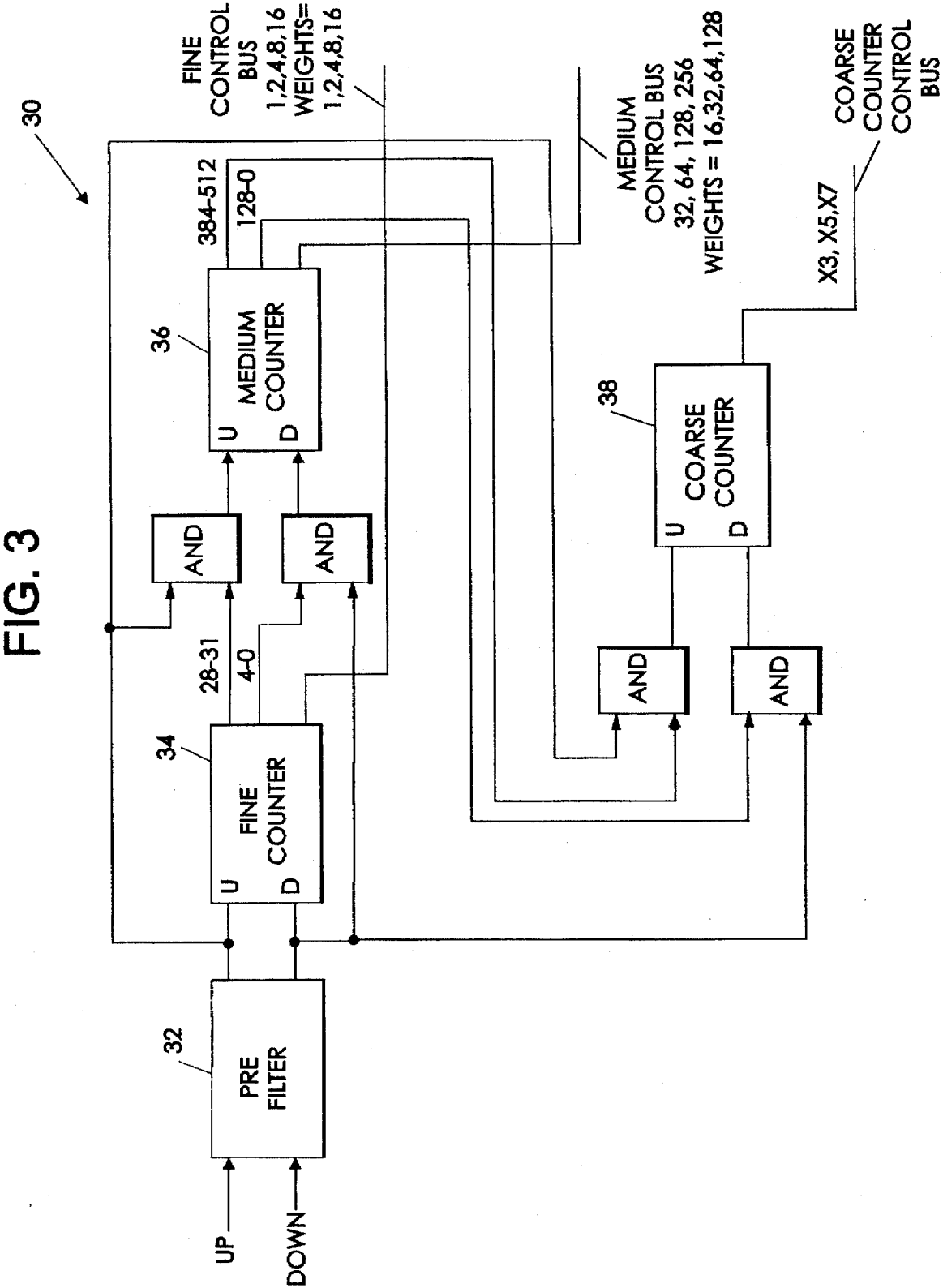
FIG. 3 is a block diagram of the filter of FIG. 2 in accordance with the present invention.

Digital PLL 20 includes a digitally controlled oscillator 22 having an output connected to a divide circuit 24 which has an output which is the output line for the PLL on line 25. The output on line 25 is connected to an input of a second divide circuit 26 which has an output connected as input to phase comparator circuit 28. A second input to phase comparator circuit 28 is a reference frequency signal on line 21. A program multiplication rate for the PLL 20 is provided to divide circuits 24 and 26 on bus 27. Outputs of phase comparator circuit 28 are connected as inputs to filter 30 which provides digital control signals to DCO 22. Filter 30 includes an input pre-filter 32 which has outputs connected to a fine filter 34, a medium filter 36, and a coarse filter 38. That is, as shown in FIG. 2, fine filter 34, medium filter 36, and coarse filter 38 provide digital control signals to DCO 22 as will be discussed herein below. Coarse filter 38 may be implemented as is shown in FIG. 3 as a control for the number of stages (e.g., 3, 5 or 7 stages) in a ring oscillator circuit of the DCO 22. Filter 30 is shown in greater detail in FIG. 3 and will be described in greater detail below. The PLL 20, as shown in FIG. 2, has four levels of control. These are the program multiplication rate which provides for the input frequency and multiply factor of the PLL 20 (as provided by MULT BUS 27), a coarse frequency control which controls a number of stages in the ring oscillator of DCO 22, a medium control which compensates for variations in parameters such as voltage and temperature, and a fine control which provides compensation for variation in loop dynamics and noise.

Referring now to FIG. 3, filter 30 will be described in greater detail.

Filter 30 controls selection of delay increments which determine frequency output of PLL 20. Fine counter 34, medium counter 36, and coarse counter 38 are up/down counters of the saturating type. That is, these counters do not step from full to empty, or vice versa. Pre-filter 32 is also implemented as an up/down counter.

There are three levels of control, fine control, medium control, and coarse control. The fine controls produce delays that change in a monotonic fashion. These delays are produced as outputs of fine counter 34 driven by pre-filter 32. In some implementations, a pre-filter is not used. In such implementations, fine counter 34 would be driven directly by phase comparator 28. Fine counter 34 has an up output and a down output which drive the up inputs and down inputs of medium counter 36. The up and down outputs of fine counter 34 are energized well within the fine adjustment range such that the fine adjustment range overlaps the coarse adjustments produced by medium counter 36. In the preferred embodiment of the invention, the fine range of adjustment is between 0 and 31 delay increments. Up and down outputs of fine counter 34 are energized at counts 28 for the up output and 4 for the down output. This allows coarse increments to be non-monotonic by four counts without introducing a monotonicity error while imposing a requirement that coarse delay steps have a transition time long enough to allow fine counter 34 to count in the opposite direction to compensate for the onset of the coarse increment. Similarly, the coarse range of adjustment of medium counter 36 is between 0 and Full (i.e., 512) delay increments. Up and down outputs of medium counter 36 are energized, for example, at counts 384 for the up output and 128 for the down output.

For example, if the PLL 20 is locked, the fine count is at 28 and an up command is generated by the pre-filter. The desired net result of a count of 29 is immediately produced by the fine counter 34, and an up command is simultaneously sent to medium counter 36, and an additional increment of 16 (i.e., counter 36 counts in increments of 16) is slowly applied to the delay of ring oscillator 40 of DCO 22. Medium counter 36 drives control inputs of DCO 22 through an inverter (not shown) to slow rise and fall times of the control signal.

As the medium counter 36 produces an output (i.e., a step increment of 16), PLL 20 causes fine counter 34 to count down to compensate (i.e., compensate for the step increment of 16 by the medium counter). The counters ultimately settle out with a fine counter setting of 13 (i.e., 29−16=13) and a medium counter setting of 16. No further control signal is applied to medium counter 36 until after fine counter 34 reaches a count of either 4 or 28. Complementary process occurs when the medium counter is decremented.

Coarse counter 38 is driven by the same up and down input signals which drive fine counter 34 and medium counter 36. It receives inputs from medium counter 36 in the same manner that medium counter 36 receives inputs from fine counter 34. There is no need to provide smooth transition between steps of coarse counter 38, since coarse counter 38 is only intended to be stepped during initialization which occurs as part of the power up process for the system.

Monotonicity errors in the medium adjustment are controlled by providing for the fine adjustment range (e.g., 0–31) to be greater than the largest medium increment (e.g., an increment of 16) and by slowing the rate at which the medium adjustments are applied such that the fine adjustment mechanism can retain control of PLL 20 during transitions.

Figure 4:
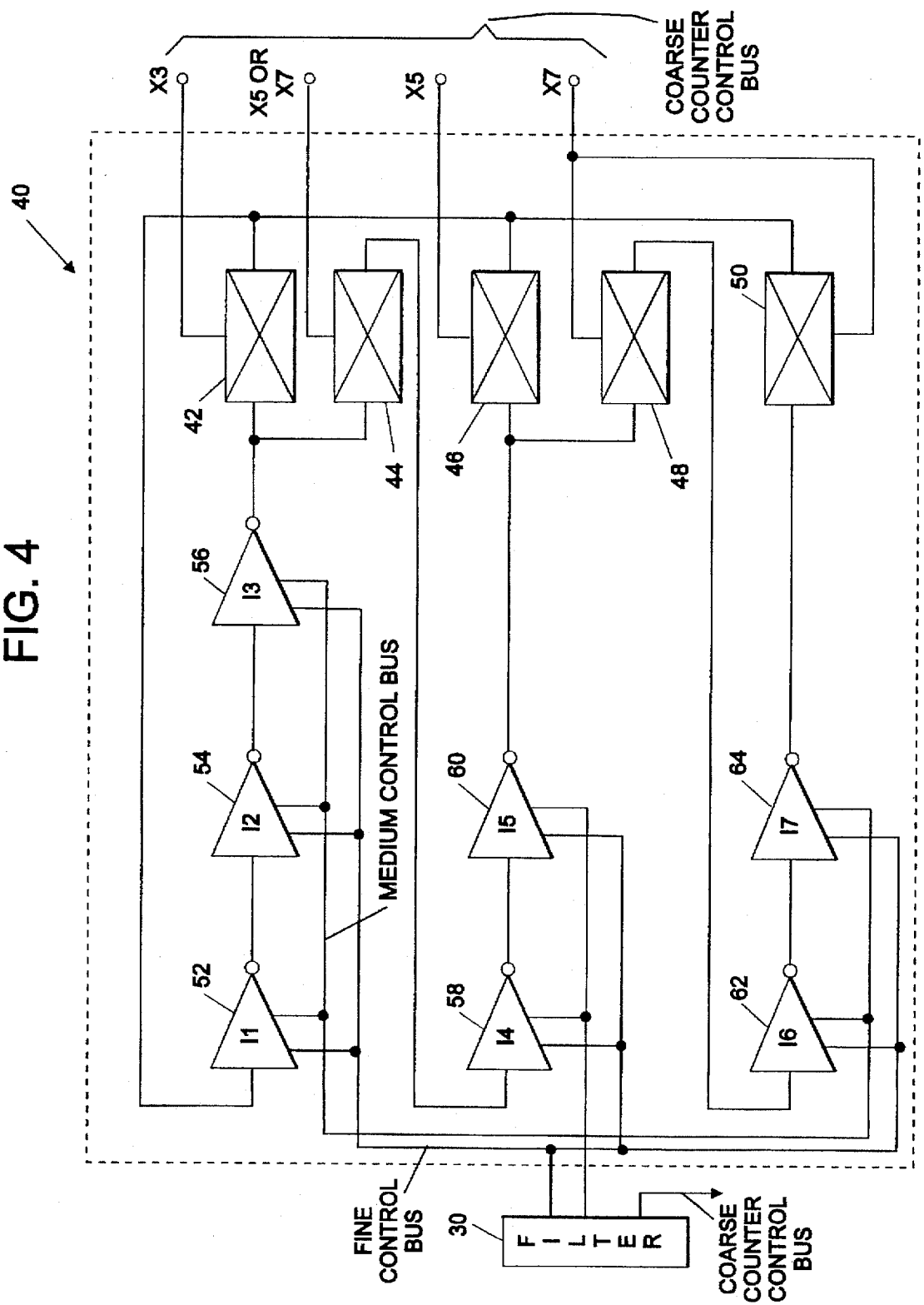
FIG. 4 is a block diagram of a digitally controlled oscillator in accordance with the present invention.

Referring now to FIG. 4, ring oscillator 40 will be described.

Control signals X3, X5, and X7 which control the number of active stages in ring oscillator 40 are outputs of coarse counter 38. Ring oscillator 40 includes, in the preferred embodiment of the present invention, seven gated delay elements 52, 54, 56, 58, 60, 62, and 64, respectively. In addition, there are five pass gates 42, 44, 46, 48, and 50 connected to outputs of series strings of delay elements 52–64 for controlling the number of delay elements in a ring and thus determining on a large scale the frequency of the ring oscillator. Pass gates 44 and 46 are activated by control inputs (X5 OR X7) and X5, respectively, as shown in FIG. 4.

If the three stages of the oscillator are to be included in the ring, signal X3 is active from coarse counter 38 which causes the oscillator to be formed of delay elements 52, 54, and 56. If five delay elements are to be included in the ring, namely, delay elements 52, 54, 56, 58, and 60, pass gates 44 and 46 are active and pass gates 42, 48, and 50 are inactive. Pass gates 44 and 46 are activated by control inputs X5+X7 and X5, respectively, as shown in FIG. 4.

If all seven delay elements are to be included in the ring, pass gates 44, 48, and 50 are active, and pass gates 42 and 46 are inactive, thus causing the ring to be a series connection of all seven delay elements 52–64, inclusive. Pass gates 44, 48 and 50 are activated by control inputs (X5 OR X7), X7 and X7, respectively, as shown in FIG. 4.

As indicated above, the control of the number of delay elements in ring oscillator 40 is a large scale control of the frequency. Finer control of the frequency is provided by the outputs of filter 30 through fine counter 34 and medium counter 36 wherein filter 30 provides digital control signals to DCO 22.

Referring now to FIG. 5, the individual delay elements 52, 54, 56, 58, 60, 62, and 64 will be described with respect to delay element 52 alone, since all the delay elements are the same.

Transistors 72 and 74 comprise a current starved inverter which is controlled by the control circuit connected between transistor 74 and ground. The delay control circuit portion of delay element 52 is divided into two parts, a first part operating under the control of fine counter 34 via the FINE CONTROL BUS, and a second part operating under the control of medium counter 36 via the MEDIUM CONTROL BUS. Transistors 76, 78, 80, 82, 84, and 86 are current sources which provide predetermined units of current to control the delay of delay element 52 with a high degree of precision. Transistors 88, 90, and 92 are switches which control fine delay increments in response to outputs of fine counter 34. The outputs of fine counter 34 thus include a set of digital control signals, for example, as illustrated in FIG. 3 and further as discussed herein with respect to the outputs of counter 34.

Transistors 82, 84, and 86 are current sources similar to transistors 76, 78, and 80 but are scaled to provide a larger delay increment. Transistors 94, 96, and 98 have gate inputs connected to outputs of medium counter 36 via the MEDIUM CONTROL BUS.

As indicated above, the outputs of medium counter 36 each have a parallel capacitive load, namely, capacitors 102, 104, and 106, to slow rise and fall times of the output of medium counter 36.

The preferred embodiment of the present invention described above includes a DCO having a ranked order of distinct groups of frequency adjustment elements, wherein each higher order group of frequency adjustment elements provides a wider range of frequency adjustment with larger frequency adjustment step sizes than the preceding group. By controlling the transition between adjustment steps over time of each higher order frequency adjustment group, resulting changes in the frequency of DCO 20 occur with a step size that is determined by the lowest order group of frequency adjustment elements, controlled by the output of fine counter 34.

Accordingly, the scope of this invention is limited only by the following claims and their equivalents.

What is claimed is:

1. An oscillator circuit, comprising:
    a phase comparator having first and second clock signal inputs, and outputs having predetermined relationships to characteristics of the first and second clock signals;
    a ring oscillator circuit;
    a first control means connected to a first output of the phase comparator for generating a first control current, the first control current having a value within a first range of control currents, the first control current being supplied to the ring oscillator, resulting in the adjustment of an output frequency of the ring oscillator circuit over a first frequency adjustment range, the first control means also providing as an output a first set of digital signals;
    a second control means connected to an output of the first control means for generating a second control current, the second control current having a value within a second range of control currents, the second control current being supplied to the ring oscillator circuit, resulting in adjustment of the output frequency of the ring oscillator circuit over a second frequency adjustment range.

2. An oscillator circuit, according to claim 1, wherein:
    the second control current is generated at a predetermined rate which is lower than the rate of generation of the first control current.

3. An oscillator circuit, according to claim 2, wherein:
    generation of the second control current is initiated while the first control current is within the first range of control currents.

4. An oscillator circuit, according to claim 1, further comprising:
    a feedback circuit, having an input responsive to an output of the ring oscillator and an output connected to an input of the phase comparator, the feedback circuit controlled by a digital signal.

5. An oscillator circuit, according to claim 1, wherein the first control means further comprises:
    a first counter providing output signals at a first resolution.

6. An oscillator circuit, according to claim 1, wherein the second control means further comprises:
    a second counter providing output signals at a second resolution.

7. A semiconductor integrated circuit, comprising:
    a phase comparator having first and second clock signal inputs, and outputs having predetermined relationships to characteristics of the first and second clock signals;
    a ring oscillator circuit;
    a first control means connected to the output of the phase comparator for generating a first control current, the first control current having a value within a first range of control currents, the first control current being supplied to the ring oscillator, resulting in the adjustment of an output frequency of the ring oscillator circuit over a first frequency adjustment range, the first control means also providing as an output a first set of digital signals;
    a second control means connected to an output of the first control means for generating a second control current, the second control current having a value within a second range of control currents, the second control current being supplied to the ring oscillator circuit, resulting in adjustment of the output frequency of the ring oscillator circuit over a second frequency adjustment range.

8. A semiconductor integrated circuit, according to claim 7, wherein:
    the second control current is generated at a predetermined rate which is lower than the rate of generation of the first control current.

9. A semiconductor integrated circuit, according to claim 8, wherein:
    generation of the second control current is initiated while the first control current is within the first range of control currents.

10. A semiconductor integrated circuit, according to claim 7, further comprising:

a feedback circuit, having an input responsive to an output of the ring oscillator and an output connected to an input of the phase comparator, the feedback circuit controlled by a digital signal.

11. A semiconductor integrated circuit, according to claim 7, wherein the first control means further comprises:

a first counter providing output signals at a first resolution.

12. A semiconductor integrated circuit, according to claim 7, wherein the second control means further comprises:

a second counter providing output signals at a second resolution.

13. A digitally controlled oscillator circuit, comprising:

a ring oscillator circuit;

a plurality of adjustment means for adjusting an output frequency of the ring oscillator circuit;

at least one of the adjustment means having monotonic behavior, adapted to switch between first adjustment levels at a first rate and at least one of the adjustment means having non-monotonic behavior, adapted to switch between second adjustment levels at a second rate which is less than the first rate, such that the means having monotonic behavior adjusts for monotonicity errors which occur during switching, wherein the plurality of adjustment means further comprises:

first and a second control circuits, the first control circuit generating a first control current, the first control current having a value within a first range of control currents, the first control current being supplied to the ring oscillator, resulting in the adjustment of an output frequency of the ring oscillator circuit over a first frequently adjustment range, the first control means also providing as an output a first set of digital signals;

a second control means connected to an output of the first control means for generating a second control current, the second control current having a value within a second range of control currents, the second control current being supplied to the ring oscillator circuit, resulting in adjustment of the output frequency of the ring oscillator circuit over a second frequency adjustment range.

14. A digitally controlled oscillator circuit, according to claim 13, wherein:

generation of the second control current is initiated while the first control current is within the first range of control currents.

15. A digitally controlled oscillator circuit, according to claim 13, wherein the first control means further comprises:

a first counter providing output signals at a first resolution.

16. A digitally controlled oscillator circuit, according to claim 13, wherein the second control means further comprises:

a second counter providing output signals at a second resolution.

\* \* \* \* \*